United States Patent
Matsuoka

(10) Patent No.: US 6,831,872 B2
(45) Date of Patent: Dec. 14, 2004

(54) SEMICONDUCTOR MEMORY DEVICE AND METHOD FOR CORRECTING A REFERENCE CELL

(75) Inventor: Nobuaki Matsuoka, Tenri (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/723,143

(22) Filed: Nov. 25, 2003

(65) Prior Publication Data

US 2004/0109353 A1 Jun. 10, 2004

(30) Foreign Application Priority Data

Dec. 4, 2002 (JP) ........................................ 2002-353052

(51) Int. Cl.⁷ ................................................ G11C 7/02
(52) U.S. Cl. ......................... 365/210; 365/208; 365/209
(58) Field of Search ................................ 365/100, 148, 365/185.03, 185.2, 185.22, 207, 208, 209, 210

(56) References Cited

U.S. PATENT DOCUMENTS

| | | | | |
|---|---|---|---|---|
| 5,172,338 A | | 12/1992 | Mehrotra et al. ...... | 365/185.03 |
| 5,828,616 A | * | 10/1998 | Bauer et al. ................. | 365/210 |
| 6,205,056 B1 | * | 3/2001 | Pan et al. ................. | 365/185.2 |
| 6,449,190 B1 | * | 9/2002 | Bill .......................... | 365/185.2 |
| 6,590,820 B2 | * | 7/2003 | Nakagawa ................... | 365/207 |

* cited by examiner

Primary Examiner—Son Mai
(74) Attorney, Agent, or Firm—Morrison & Foerster LLP

(57) ABSTRACT

A semiconductor memory device includes a plurality of memory cells each capable of storing and programming N-level data; a reference cell storing a reference level used when reading a data level stored in the memory cells; a counter circuit counting number of times of reading of the reference cell; a check means for determining whether the reference level stored in the reference cell is within a preset range when the number of times of reading that is counted reaches a specified value; and a correction means for, if the check means determines that the reference level is out of the range, correcting the reference level to fall within the range in accordance with a master reference cell. With this constitution, it is possible to provide the semiconductor memory device capable of efficiently correcting the state of the reference cell, preventing the deterioration of the reference cell due to disturbance or the like, and highly accurately maintaining the level of the reference cell.

15 Claims, 9 Drawing Sheets

SEMICONDUCTOR MEMORY DEVICE AND METHOD FOR CORRECTING A REFERENCE CELL

BACKGROUND OF THE INVENTION

1. Field of the Invention

The present invention relates to a semiconductor memory device and a method for correcting a reference cell.

2. Description of the Related Art

A conventional semiconductor memory device will be described, while taking a flash memory as an example. The flash memory changes a threshold by injecting charge into a floating gate. By controlling this quantity of charge, the flash memory controls the threshold in a plurality of states and realizes multilevel storage. If data is stored in a flash memory which can control the threshold to turn into, for example, two states (one bit, respectively), data of 16 bits is stored in 16 flash cells, respectively. In case of a flash memory which can control the threshold to turn into four states (two bits, respectively), data of 16 bits can be stored in eight flash cells. To check which of, for example, four states the threshold turns into, a flash cell is compared with a flash memory that has a reference threshold.

However, the flash memory that has the reference threshold, i.e., a reference cell is accessed repeatedly. As shown in FIG. 2, for example, the reference cell is employed to be common to all flash cells. Due to this, the number of times of access to the reference cell is far greater than the number of times of access to a certain memory cell. In addition, as for a program reference cell used to check whether the threshold is equal to a specified threshold during program (write) or a read reference used to check a threshold corresponding to each storage state during read, once the threshold is set during a test, it is difficult to change the threshold later. Therefore, the conventional flash memory has disadvantages as follows. By repeatedly using the flash memory, the threshold of the reference cell lowers, which often makes it impossible to perform normal reading or programming. Further, in a multilevel memory cell, a threshold distribution range of which in a certain state is narrow, the deterioration of the reference cell is more serious.

To solve the disadvantages, the following method is proposed in U.S. Pat. No. 5,172,338. According to the U.S. Pat. No. 5,172,338, a reference cell is provided in each sector of a flash memory. The reference cells are simultaneously erased when the flash cell is performed block erasure and the reference cell in each block is reprogrammed using a master reference cell present independently of the other reference cells.

As multilevel rises, the range of a resistance corresponding to each storage state narrows. This requires high accuracy in the program reference cell and the read reference cell. However, by repeatedly performing a read operation (read), a program operation (program) and an erase operation (erase), the reference cell is disadvantageously deteriorated. As stated above, such a constitution that the reference cell is erased simultaneously with the block erasure and reprogrammed using the master reference cell is effective for a memory such as a flash memory that performs block erasure. However, if this constitution is adopted in a memory that erases data bit by bit, it is necessary to correct the reference cells whenever one bit is erased, which disadvantageously deteriorates efficiency.

SUMMARY OF THE INVENTION

It is, therefore, an object of the present invention to efficiently check a state of a reference cell, correct the reference cell, prevent a deterioration in the reference cell due to disturbance or the like, and highly accurately maintain a level of the reference cell so as to overcome the disadvantageous deterioration of the reference cell due to repetition of a read operation, a program operation, and an erase operation.

According to a first aspect of the present invention, there is provided a first characteristic constitution of a semiconductor memory device, i.e., a semiconductor memory device characterized by comprising: the plurality of memory cells each capable of storing and programming N-level data, where N is a natural number equal to or greater than 2; a reference cell storing a reference level used when reading a data level stored in the memory cells; a counter circuit counting number of times of reading of the reference cell; and check means for determining whether the reference level stored in the reference cell is within a preset range when the number of times of reading that is counted by the counter circuit reaches a specified value.

Namely, generally, a check processing for determining whether or not program is normally completed, erase is normally completed, or the like is performed whenever an arbitrary memory cell is accessed following a read operation, a program operation, and an erase operation for the arbitrary memory cell. Whenever the check processing is performed, a reference cell read operation is executed. The counter circuit counts the number of times of reading of the reference cell. When the number of times of reading counted reaches the specified value with which it is assumed that the reference level is not out of the variation allowable range, the check means determines whether the reference level stored in the reference cell is within the preset range. By doing so, the accuracy of the reference level is ensured without the need of checking it whenever the read operation, the program operation or the erase operation is performed. In this specification, a check processing for determining whether programming, erase or the like is normally completed by comparing the arbitrary memory cell with the reference cell or a check processing for determining whether the reference level stored in the reference cell is within the preset range, which check processing is performed whenever the memory cell is accessed following the read operation, the program operation, and the erase operation for the memory cell, is also referred to as "verify".

With the above-stated configuration, the counter circuit counts the number of times of reading of the reference cell in at least one of the read operation, the program operation, and the erase operation for the memory cell, whereby the check operation can be performed more efficiently. For example, if a stress causing a change of a threshold and applied to the reference cell differs among the read operation, the program operation, and the erase operation for the memory cell, it is preferable to count the number of times of reading following the operation in which the maximum stress is applied to the memory cell. By doing so, the check operation can be performed more efficiently.

According to a second aspect of the present invention, there is provided a second characteristic constitution of the semiconductor memory device, i.e., a semiconductor memory device characterized by comprising: the plurality of memory cells each capable of storing and programming N-level data, where N is a natural number equal to or greater than 2; a reference cell storing a reference level used when reading a data level stored in the memory cells; a timing generation circuit; and check means for determining whether the reference level stored in the reference cell is within a preset range, in synchronicity with a synchronous signal output from the timing generation circuit.

Namely, it is assumed that the occurrence of a malfunction caused by the deterioration of the reference cell correlates with stress accumulation time from an initial state until a stress at a predetermined level is accumulated. By checking the reference level at the predetermined timing before such a malfunction occurs, it is possible to ensure the accuracy of the reference level without the need of checking it whenever the read operation, the program operation or the erase operation is performed.

Besides the above constitution, if the semiconductor memory device is constituted so that if the check means determines that the reference level is out of the range, the correction means corrects the reference level to fall within the range, stable operation is always ensured.

If the correction of the reference level is made using the master reference level fixed to the master reference cell other than the reference cell, it is possible to ensure correcting the reference cell. This is because the master reference cell is accessed quite infrequently and, therefore, hardly deteriorated. It is preferable herein that the master reference cell consists of a fixed resistance element which does not cause deterioration by an electric stress.

It is preferable that the each of the memory cells and the reference cells consists of a nonvolatile variable resistance element, whose electric resistance is changed by an electric stress and remains on the changed electric resistance even after the electric stress is removed, and a select transistor. Preferably, the nonvolatile variable resistance element has a manganese-containing oxide of a perovskite structure formed between electrodes.

According to a third aspect of the present invention, there is provided a first characteristic constitution of a method for correcting a reference cell, i.e., a method for correcting a reference cell, the reference cell storing a reference level used when reading a data level stored in the plurality of memory cells each capable of storing and programming N-level data, where N is a natural number equal to or greater than 2, the method characterized by comprising the steps of: counting number of times of reading of the reference cell; determining whether the reference level stored in the reference cell is within a preset range when the number of times of reading that is counted reaches a specified value; and correcting the reference value to fall within the range if it is determined that the reference level is out of the range.

According to a fourth aspect of the present invention, there is provided a second characteristic constitution of the method for correcting a reference cell, i.e., a method for correcting a reference cell, the reference cell storing a reference level used when reading a data level stored in the plurality of memory cells each capable of storing and programming N-level data, where N is a natural number equal to or greater than 2, the method comprising the steps of determining whether the reference level stored in the reference cell is within a preset range, in synchronicity with a synchronous signal output from a timing generation circuit; and correcting the reference value to fall within the range if it is determined that the reference level is out of the range.

DETAILED DESCRIPTION OF THE INVENTION

A semiconductor memory device and a reference cell correction method according to the present invention will be described hereinafter with reference to the drawings.

Figure 1:
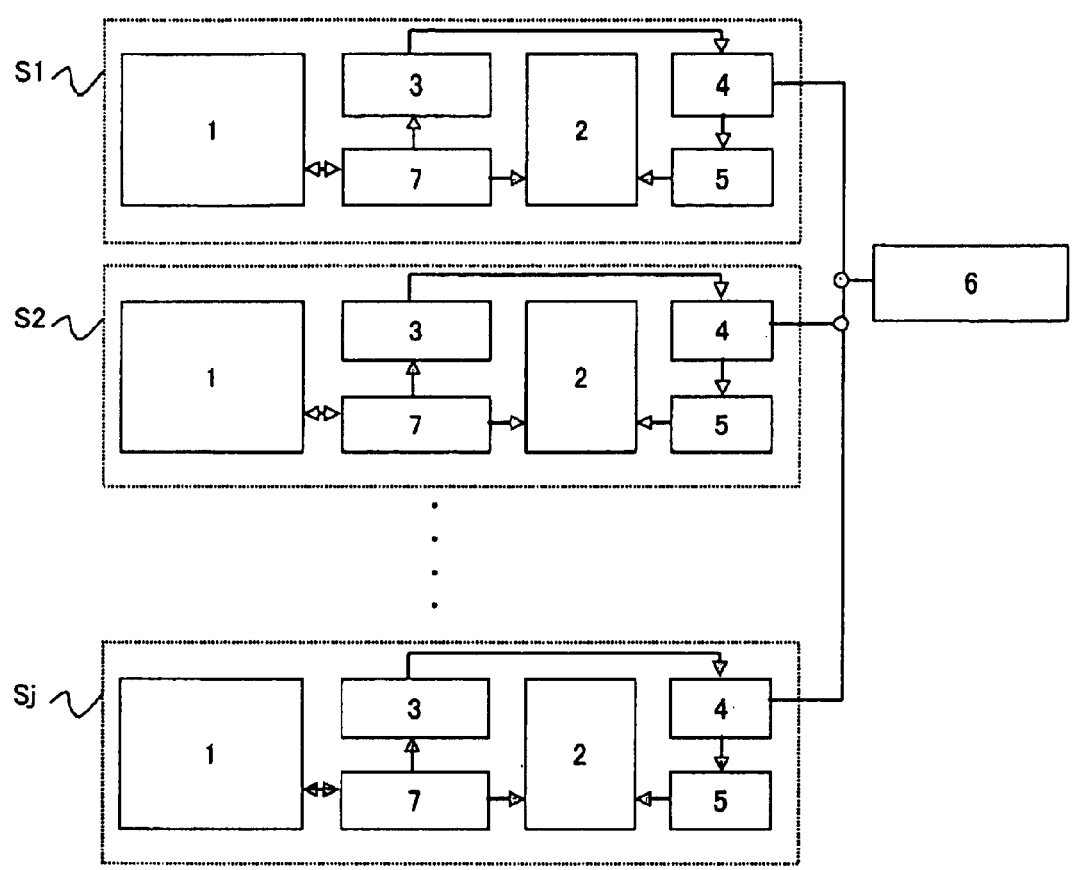
FIG. 1 is a circuit block diagram which illustrates one embodiment of a semiconductor memory device according to the present invention.
Figure 2:
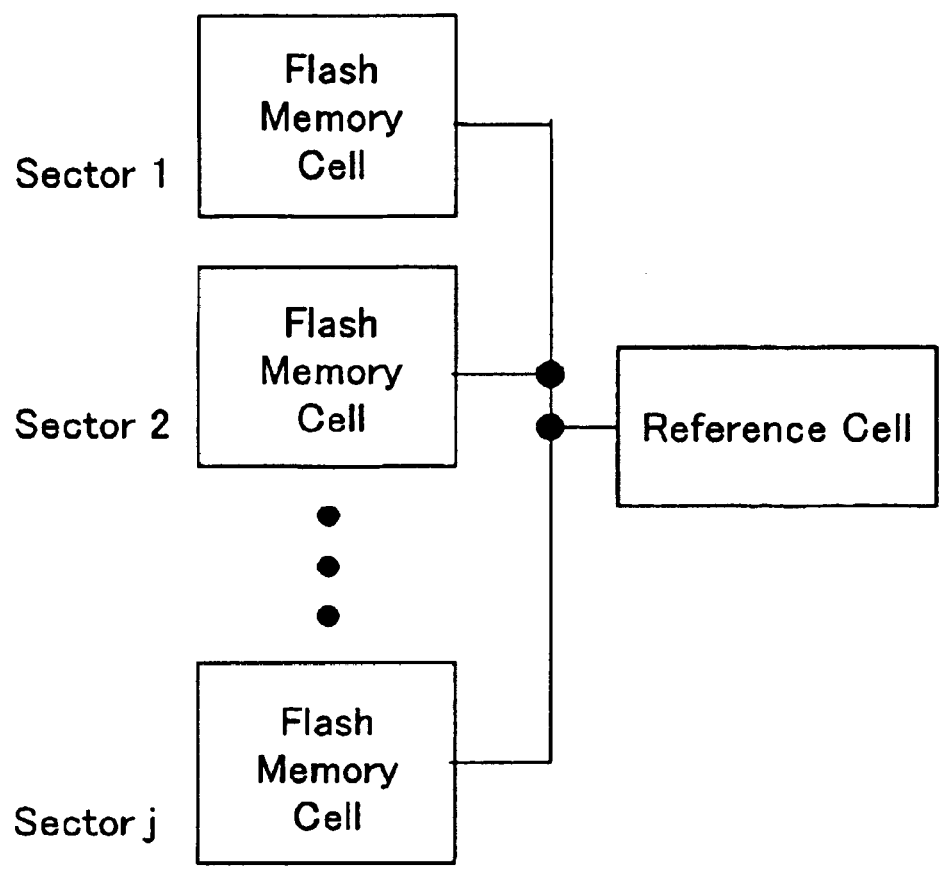
FIG. 2 is a circuit block diagram of a conventional flash memory.

As shown in FIG. 1, a chip is divided into the plurality of sectors S1 to Sj, and the semiconductor memory device includes, per sector, the plurality of memory cells 1 each capable of storing and programming N-level data (where N is a natural number equal to or greater than 2), a memory access circuit 7 that executes a read operation, a program operation, and an erase operation to the memory cells 1, a reference cell 2 that stores a reference level used to read a data level stored in each of the memory cells 1, a counter circuit 3 that counts the number of times of reading of the reference cell 2, check means 4 that determines whether the reference level stored in the reference cell is within a preset range when the number of times of reading counted by the count circuit 3 reaches a specified value, and correction means 5 for correcting the reference level to fall within the range based on a master reference cell 6 if the check means 4 determines that the reference level is out of the range.

Each of the memory cells 1, the reference cell 2, and the master reference cell 6 consists of a nonvolatile variable resistance element that holds an electric resistance, changed by an electric stress generated by application of a voltage or the like, even after removing the electric stress, and a select transistor. In this embodiment, a Novel Resistance Control Nonvolatile RAM (hereinafter, "RRAM") element is used as the nonvolatile variable resistance element. The RRAM element is a nonvolatile storage element that has the electric resistance changed by the application of the electric stress and that holds the changed electric resistance even after the electric stress is removed, whereby the RRAM element can store the data according to the resistance change. The RRAM is manufactured by forming a film out of, for example, a substance expressed by one of $Pr_{(1-x)}Ca_xMnO_3$, $La_{(1-x)}Ca_xMnO_3$, and $La_{(1-x-y)}Ca_xPb_yMnO_3$ (where x<1, y<1, x+y<1), e.g., forming a film of a manganese-containing oxide such as $Pr_{0.7}Ca_{0.3}MnO_3$, $La_{0.65}Ca_{0.35}MnO_3$, and $La_{0.65}Ca_{0.175}Pb_{0.175}MnO_3$ by MOCVD method, spin coating method, laser abrasion, sputtering method, or the like.

In the following specification, "increase the resistance" of the RRAM element is expressed by "program" and "decrease the resistance" is expressed by "erase". Normally, during programming, the select transistor is turned on, voltages of 3V and 0V are applied to a bit line and a source line, respectively. Conversely, during erase, the select transistor is turned on and voltages of 0V and 3V are applied to the bit line and the source line, respectively. During reading, the select transistor is turned on and voltages of 1.5V and 0V are applied to the bit line and the source line, respectively. The RRAM element is constituted to change and supply the respective voltages by a voltage generation circuit. The voltage values are not limited to those stated above but may be appropriately set according to individual characteristics of the nonvolatile variable resistance element. Thus, the configuration of the variable resistance element is not limited to that described in this embodiment.

The data in the reference cell 2 in each sector is checked by a signal from the counter circuit 3 that stores the number of times of access to the reference cell 2 which number is generated in accordance with a check operation following each of the read operation, the program operation, and the erase operation for each memory cell 1 executed by the access circuit 7. The check means 4 determines whether a state of the reference cell is within a predetermined distribution range after receiving a signal indicating that the number of times of access to the reference cell counted by the counter circuit 3 reaches a specified number of times.

The correction means 5 corrects the reference level of the reference cell 2 so that the state of the reference cell 2 falls within the predetermined distribution range using the master reference cell 6 if a check processing of the check means 4 shows that the state of the reference cell 2 is out of the predetermined distribution range. The correction is made by erasing and reprogramming the reference level of the reference cell 2 in each sector or by only reprogramming the reference cell 2. In this embodiment, the count circuit 3 counts the number of times of access to the reference cell 2 in any of the program operation, the erase operation, and the read operation to each memory cell 1. However, the manner of correction can be selected from among a manner of counting only the number of times of access to the reference cell 2 to determine whether data is correctly programmed to the memory cell 1 after the data is programmed thereto, a manner of counting the number of access to the reference cell 2 so as to determine whether data is correctly erased from the memory cell 1 after the data is erased therefrom, a manner of counting the number of times of reading, and a manner of a combination of the cases. For example, if a stress which is applied to the reference cell 2 and which causes a change in the resistance of the RRAM element differs among the read operation, the program operation, and the erase operation for the memory cell 1, the number of times of reading following the operation in which the maximum stress is applied to the reference cell 2 is counted, whereby the check operation can be performed more efficiently.

The master reference cell 6 is employed only to reset the resistance of the erased sector reference cell in each sector. The sector reference cell 2 is accessed simultaneously with the access to the memory cell 1 in the same sector. The master reference cell 6 is accessed only when the sector reference cell 2 is erased and reprogrammed.

Figure 3:
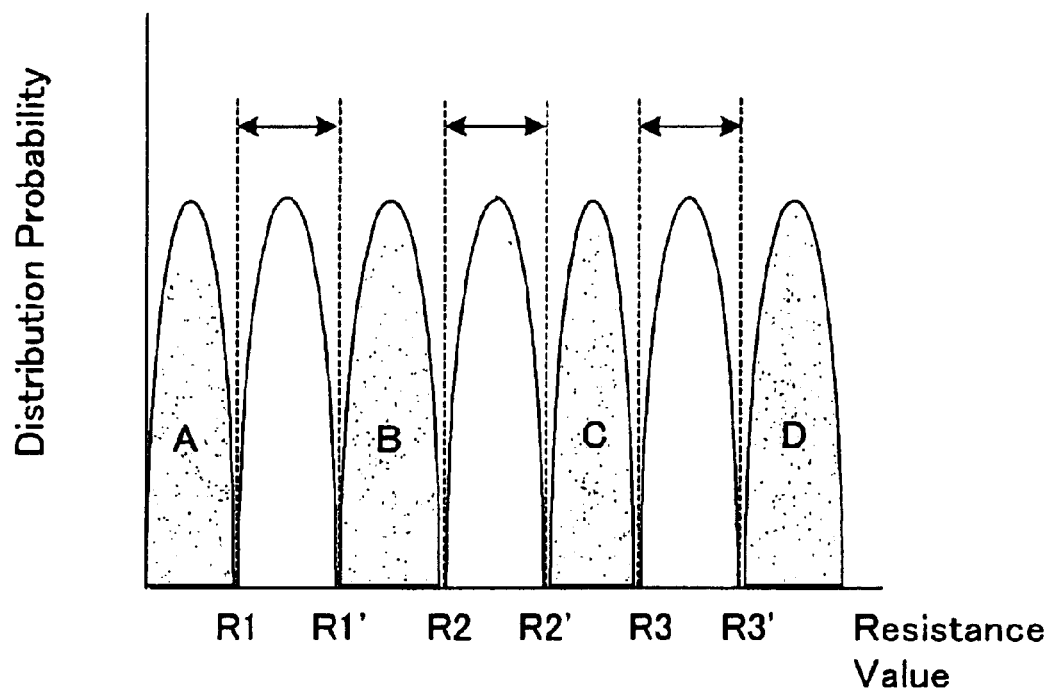
FIG. 3 is an explanatory view for a resistance distribution of a memory cell.

Next, a method of setting the resistance of the reference cell 2 will be described with reference to FIG. 3. In this embodiment, the reference cell 2 which is used for the RRAM element capable of storing four states in a memory cell will be described by way of example. In FIG. 3, symbols A, B, C, and D represent respective four states stored in the memory cell 1. To discriminate these four states, three reference cells that discriminates boundaries of the states are required. Among three resistances, a first sector reference cell resistance Rref1 is set as given by the following formula (1). Likewise, second and third sector reference cell resistances are Rref2 and Rref3, which are set as given by the following formulas (2) and (3), respectively. Since a value of (R1'−R1) is smaller, more resistance states can be formed, which is convenient for multilevel storage.

$$R1 < Rref1 < R1' \tag{1}$$

$$R2 < Rref2 < R2' \tag{2}$$

$$R3 < Rref3 < R3' \tag{3}$$

Figure 4:
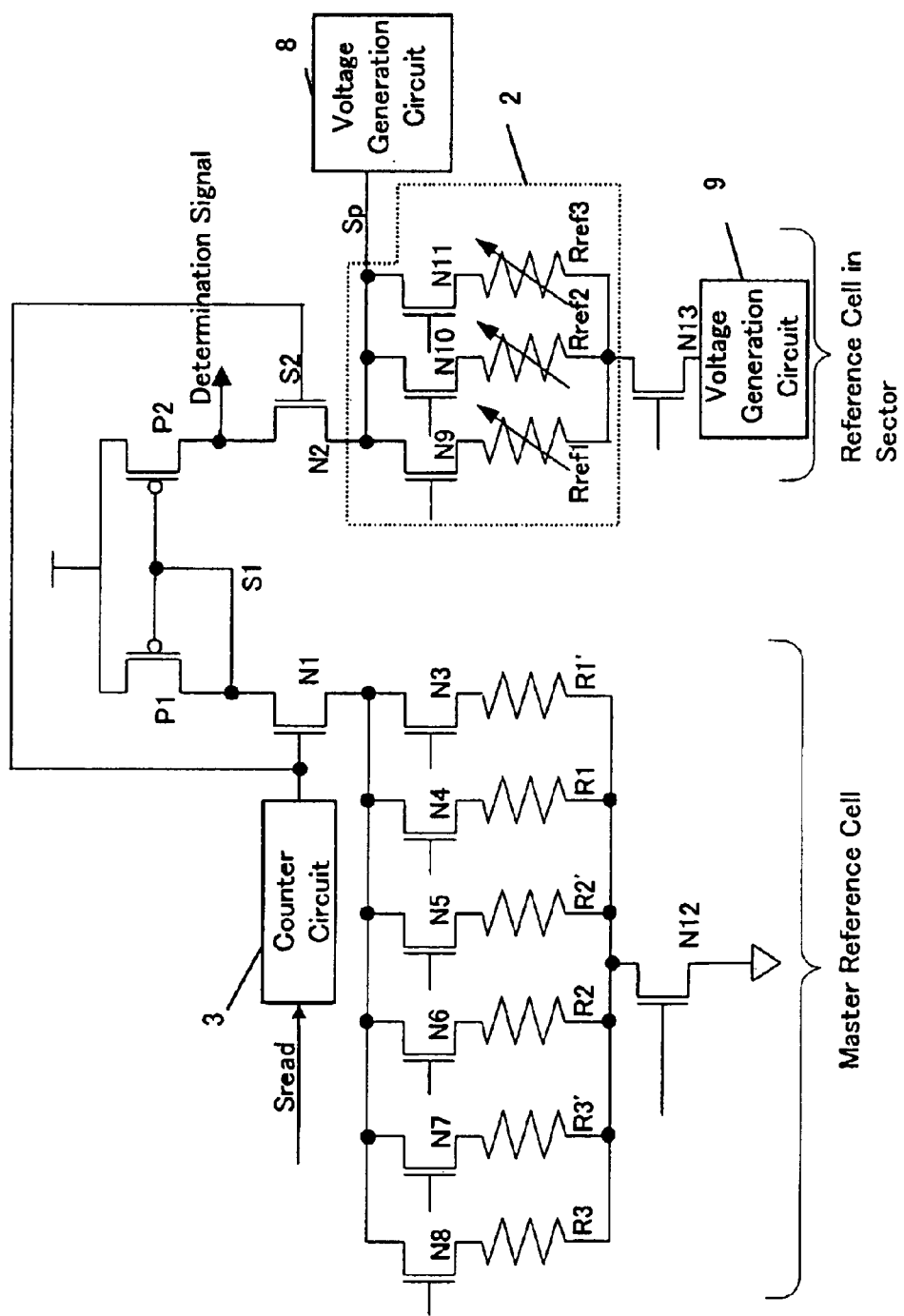
FIG. 4 is a circuit diagram which illustrate important sections of the semiconductor memory device according to the present invention.

A method of setting the resistances will next be described with reference to the circuit shown in FIG. 4. Sources of P type MOSFET's P1 and P2 are connected to power supply voltages, gates thereof are connected in common, and the gate and a drain of P1 are connected to each other through a node S1, whereby the P type MOSFET's P1 and P2 constitute a current mirror. Drains of P1 and P2 are connected to drains of N type MOSFET's N1 and N2, respectively. A gate of the N1 is connected to an output of the counter circuit 3, and the counter circuit 3 inputs a signal (Sread) that indicates 'read', 'program verify', and 'erase verify'. The output of the counter circuit 3 is connected to a gate of the N2 through the node S2. Drains of N type MOSFET's N3 to N8 that serve as select switches for the master reference cell are connected to a source of the N1. One end of the RRAM element that constitutes the master reference cell 6 is connected to sources of the N3 to N8, the other end thereof is connected to a drain of an N type MOSFET N12 that serves as a switch for setting a ground level, and a source of the N12 is connected to the ground level. A source of the N2 is connected to drains of N type MOSFET's N9 to N11 that serve as select switches of each sector reference cell 2 and to an output of a voltage generation circuit 8 that switches over a high voltage to/from the ground level and outputs the high voltage or ground level, through a node Sp. One end of the RRAM element that constitutes the sector reference cell 2 is connected to sources of the N9 to N11, and the other end thereof is connected to an output of a voltage generation circuit 9 that can switch over the ground level to/from the high voltage and output the ground level or the high voltage.

Figure 5:
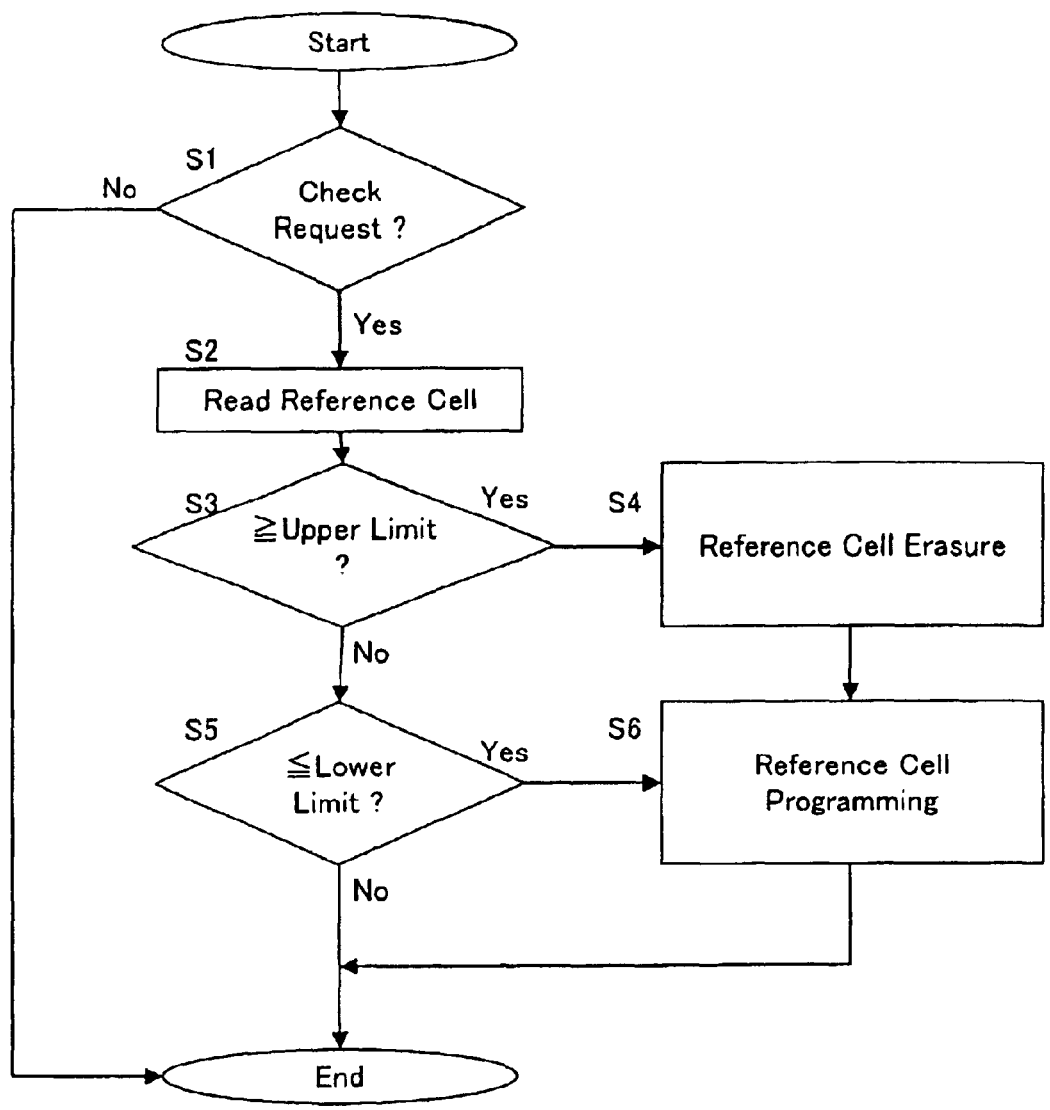
FIG. 5 is a flow chart which illustrates a reference cell correction processing performed in the semiconductor memory device according to the present invention.

Operations of the circuit shown in FIG. 4 will next be described with reference to FIG. 5. In a step S1, it is determined whether a check request signal from the counter circuit 3 is output to the node S2. If the check request signal is not output, a processing is finished without correcting the reference level of the sector reference cell 2. If the check request signal is output, the processing moves to a step S2. In the step S2, data programmed to the sector reference cell 2 is read. In a step S3, it is determined whether a state of the sector reference cell 2 is equal to or higher than an upper limit of an expected distribution range.

If it is determined that the state is equal to or higher than the upper limit, the reference level of the sector reference cell 2 is erased (a state of A in FIG. 3) in a step S4. In a step S6, the program operation is continued until the state of the sector reference cell 2 falls within the expected distribution range and the data level of the sector reference cell 2 is corrected. If it is determined that the state of the sector reference cell 2 is not equal to or higher than the upper limit, it is determined whether the state is equal to or lower than a lower limit of the expected distribution range in a step S5. If it is determined that the state is equal to or lower than the lower limit, then the program operation is continued until the state of the sector reference cell 2 falls within the expected distribution range, and the data programmed to the sector reference cell 2 is corrected in a step S6. If it is determined that the state is not equal to or lower than the lower limit, the data programmed to the sector reference cell 2 is not corrected.

The operations of the circuit shown in FIG. 4 will be described in detail, while referring to a case where the resistance of the sector reference cell 2 is set to satisfy R1<Rref1<R1'. It is determined whether the check request signal is output from the counter circuit 3. If the check request signal is output, then the N type MOSFET's N1, N2, N3, N9, N12, and N13 are turned on, the sector reference cell Rref1 of the sector reference cell 2 is read and the sector reference cell Rref1 is compared with the resistance R1' of the master reference cell. Namely, the check means 4 is constituted out of the current mirror circuit and peripherals of the current mirror circuit. If a determination signal indicates R1'<Rref1, the Rref1 is erased (the state of A shown in FIG. 3). Specifically, after turning off the N type MOSFET N2 and turning on the N type MOSFET's N9 and N13, the node Sp is kept at the ground level, the high voltage is output from the voltage generation circuit 9, and the voltage is applied to the Rref1, whereby the Rref1 is erased.

If the determination signal indicates R1'>Rref1, then the N type MOSFET's N1, N2, N4, N9, N12, and N13 are turned on and the resistance R1 of the master reference cell is compared with the sector reference cell Rref1. If the determination signal indicates R1>Rref1, programming is performed to increase the resistance. Specifically, the N2 is turned off, the N9 and N13 are turned on, the voltage generation circuit 8 outputs the high voltage, and the voltage generation circuit 9 outputs the ground level, whereby the voltage is applied and data is programmed to the RRAM element.

A series of the program operation and the program verify operation are repeatedly performed until the resistance Rref1 of the reference cell 2 satisfies R1<Rref1<R1'. Namely, the correction means 5 is constituted out of the current mirror circuit, the voltage generation circuits 8 and 9, and the peripheral circuits thereof. Likewise, in order to set the resistance Rref2 of the sector reference cell 2 to satisfy R2<Rref2<R2', the N1, N2, N5, N6, N10, N12, and N13 are controlled.

Figure 6:
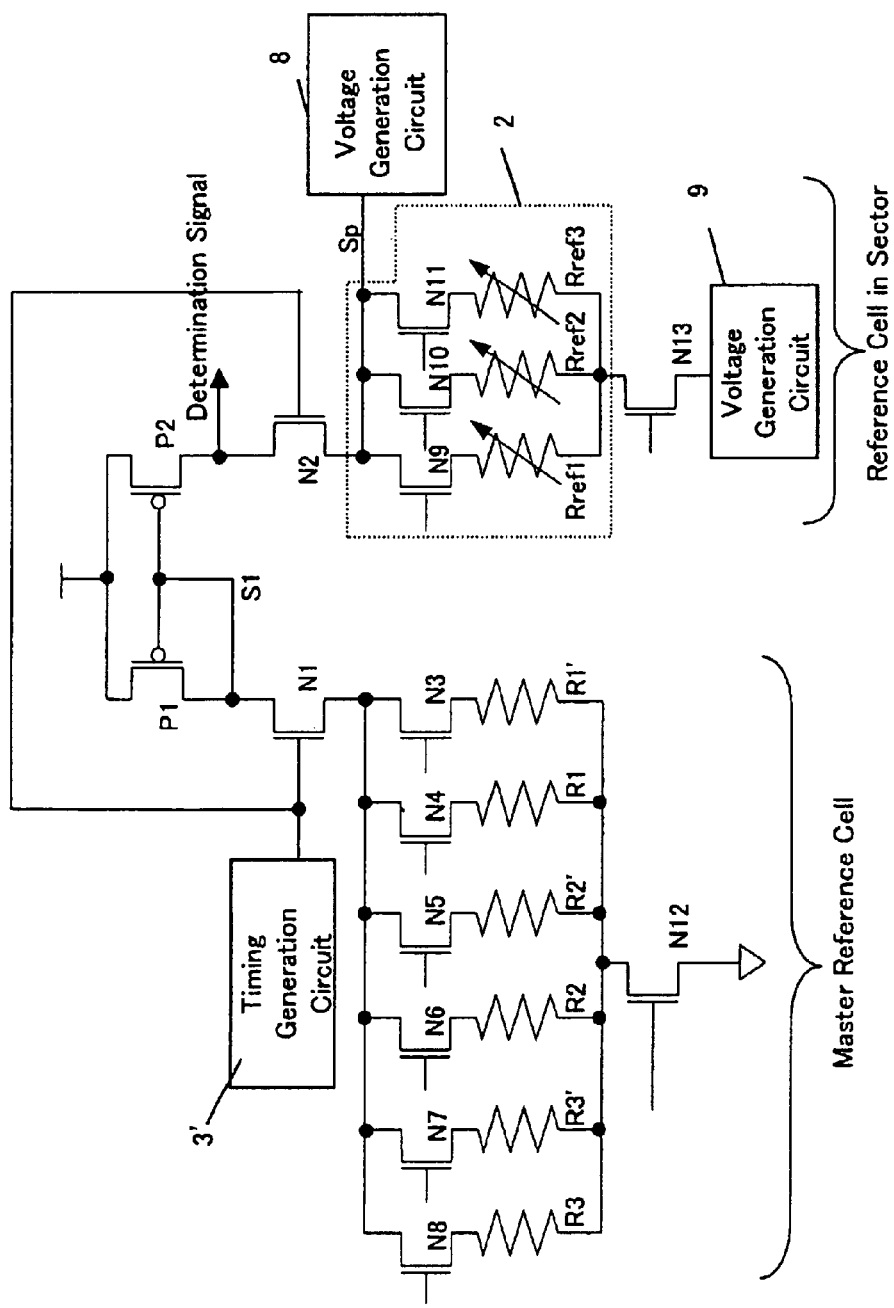
FIG. 6 is a circuit diagram which illustrates important sections of a semiconductor memory device in another embodiment according to the present invention.

So far, the operations of regularly checking the states of the sector reference cells and correcting the data programmed to the respective sector reference cells by employing the counter circuit 3 have been described. Another embodiment of the present invention will now be described with reference to FIG. 6. The difference of this embodiment shown in FIG. 6 from the embodiment shown in FIG. 4 is that a timing generation circuit 3' is employed in place of the counter circuit 3. The counter circuit 3 counts the number of times of 'program verify', 'erase verify', and 'read' for the memory cells, thereby regularly erasing and programming the data from and to the sector reference cells 2. In this embodiment, the semiconductor memory device functions to perform erase and program operations at certain timings irrespectively of the number of times of access. For example, each sector reference cell 2 is subjected to erase and reprogramming operations to refresh the sector reference cell 2 per hour, whereby accuracy of the sector reference cell can be maintained. Alternatively, the semiconductor memory cell may be constituted to include both the counter circuit 3 and the timing generation circuit 3' so that when the check request signal is output earlier from one of the circuits 3 and 3', the check processing and the correction processing are performed.

Figure 7:
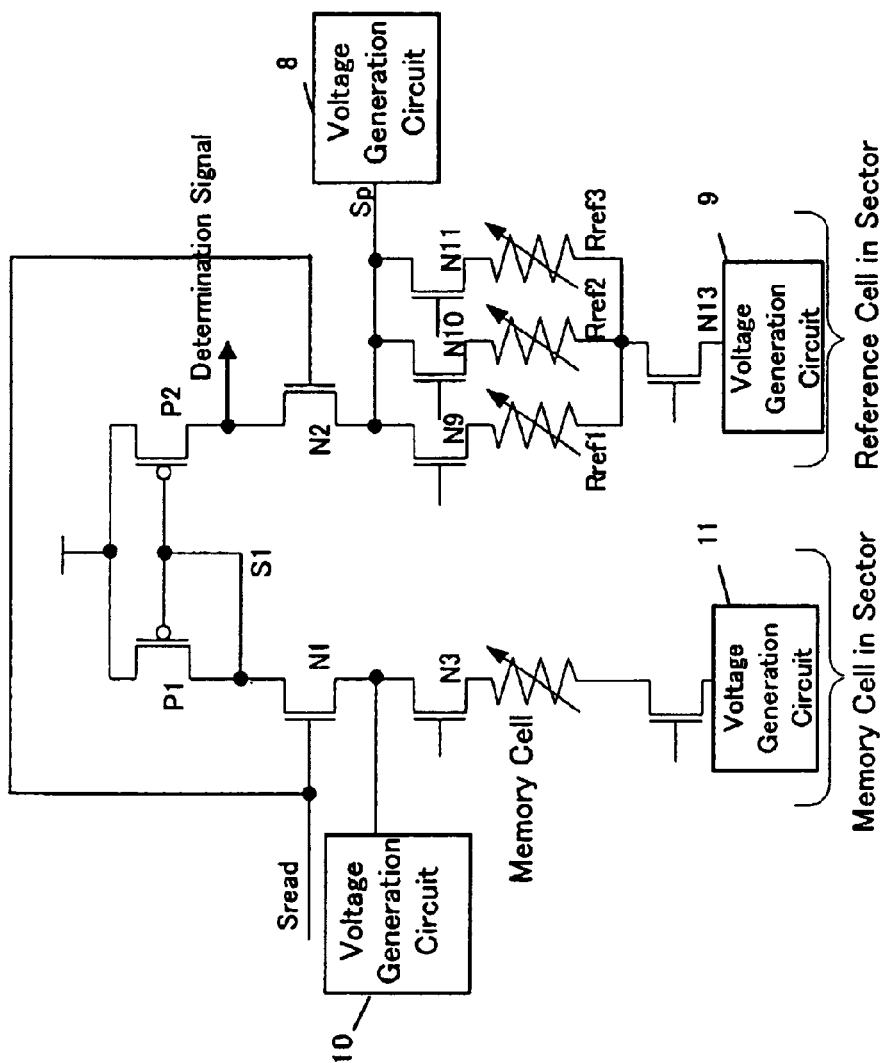
FIG. 7 is a circuit diagram which illustrates important sections for a read operation performed by the semiconductor memory device according to the present invention.

A data read operation for reading data from the memory cell 1 will be described. As shown in FIG. 7, in the arbitrary memory cell selected by the access circuit 7, an output of a voltage generation circuit 10 is set in a high impedance state and a voltage generation circuit 11 is set at the ground level. In the selected reference cell 2, the output of the voltage generation circuit 8 is set in a high impedance state, the voltage generation circuit 9 is set at the ground level, and currents carried to the current mirror circuit are compared, thereby reading data from the memory cell.

Figure 8:
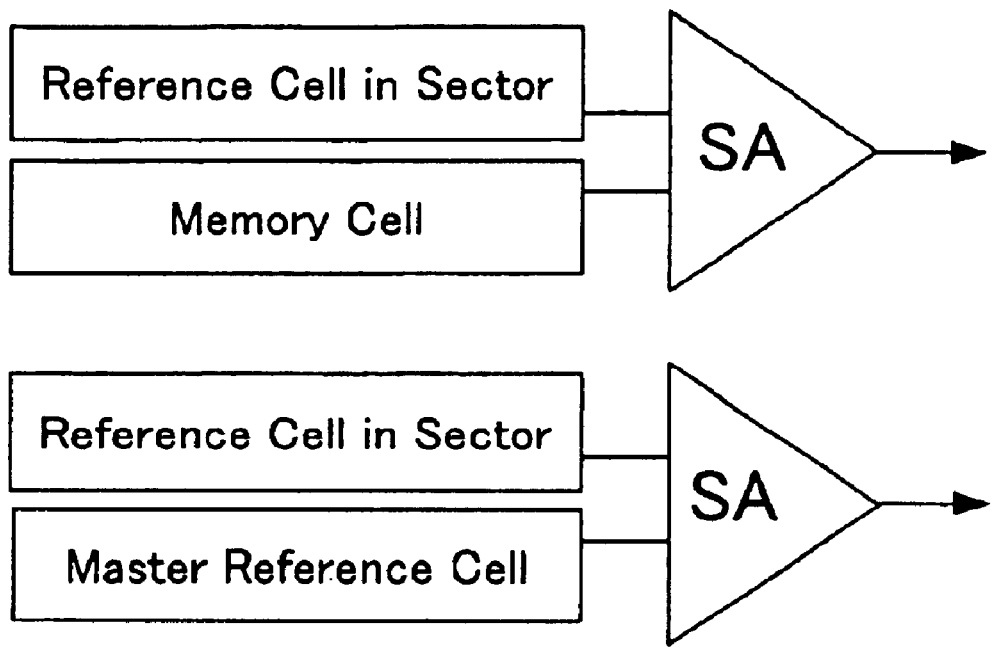
FIG. 8 is a circuit block diagram which illustrate important sections of the semiconductor memory device according to the present invention.
Figure 9:
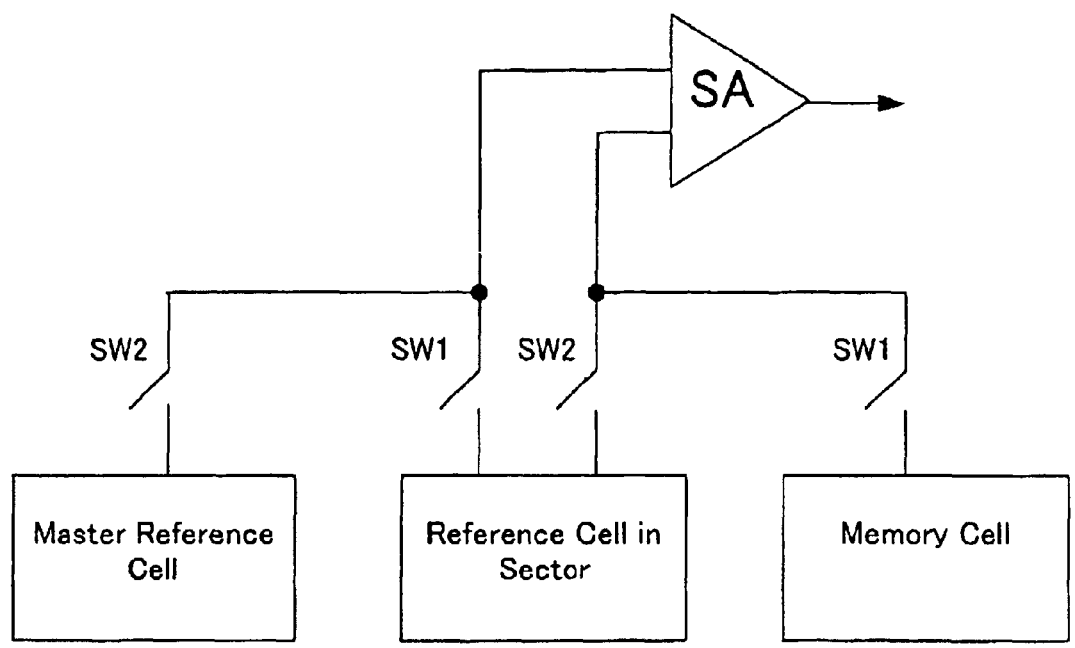
FIG. 9 is a circuit block diagram which illustrates important sections of the semiconductor memory device according to the present invention.

As stated above, the resistance comparison between the master reference cell 6 and the sector reference cell 2 and that between the memory cell 1 and the sector reference cell 2 can be performed by detecting the currents carried to the current mirror circuit. Alternatively, they can be performed by detecting voltage using differential amplifier circuits. FIG. 8 illustrates one example of the latter case and illustrates that the semiconductor memory device includes independent comparators SA's. Alternatively, sense amplifiers employed to read data from the memory cell 1 and perform the program verify operation can be used to serve as such comparators. In this case, the semiconductor memory device can be constituted as shown in FIG. 9. Namely, during the read operation and the program verify operation for the selected memory cell, a switch sw1 is turned on, a switch sw2 is turned off, the selected memory cell and the sector reference cell are connected to a sense amplifier, and data is output. On the other hand, during reprogramming of the sector reference cell, the switch sw1 is turned off, the switch sw2 is turned on, the sector reference cell and the master reference cell are connected to the sense amplifier, and the program operation is repeatedly performed until the resistance of the sector reference cell reaches the specified resistance.

In the embodiments, the semiconductor memory device that includes the correction means that corrects the reference level stored in the reference cell so that the reference level falls within the preset range if the check means determines that the reference level is out of the preset range has been described. However, in case of a semiconductor memory device employed to measure a degree of a stress in a test or having product specifications that a life of the device is terminated when it is determined that the reference cell is abnormal, it suffices that the device includes the check means to grasp the result of the check means and does not always include the correction means.

In the embodiments described above, the RRAM element is employed in each of the memory cells, the reference cells, and the master reference cell. Alternatively, by employing a fixed resistance for the master reference cell in place of the RRAM element, it is possible to ensure high accuracy of the master reference cell.

In the embodiments described above, the program state detection means is constituted using the voltage detection type differential amplifier circuits. However, the configuration of the program state detection means is not limited to that described in the embodiments but the means can be appropriately constituted according to a detection target. For example, using current detection type differential amplifier circuits, the resistances can be indirectly detected.

In the embodiments described above, the RRAM element is employed in each of the memory cells, the reference cells, and the master reference cell. Alternatively, an MRAM element a resistance of which is changed according to a magnetization direction, an OUM element a resistance of which is changed according to a change of a crystal state due to heat, or the like can be employed in place of the RRAM element.

As described so far, according to the present invention, by repeatedly performing the read operation, the program operation, and the erase operation, it is possible to efficiently check the state of the reference cell, correct the reference cell, prevent the deterioration of the reference cell due to disturbance or the like, and maintain the reference level stored in the reference cell with high accuracy even if the deterioration of the reference cell occurs.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor memory device comprising:

a plurality of memory cells each capable of storing and programming N-level data, where N is a natural number equal to or greater than 2;

a reference cell storing a reference level used when reading a data level stored in said memory cells;

a counter circuit counting number of times of reading of said reference cell; and check means for determining whether said reference level stored in said reference cell is within a preset range when said number of times of reading that is counted by said counter circuit reaches a specified value.

2. The semiconductor memory device according to claim 1, wherein said counter circuit counts the number of times of reading of said reference cell in at least one of a read operation, a program operation, and an erase operation for said memory cells.

3. The semiconductor memory device according to claim 1, comprising correction means for, if said check means determines that said reference level is out of said range, correcting the reference level to fall within said range.

4. The semiconductor memory device according to claim 3, wherein said correction means corrects said reference level using a master reference level fixed to a master reference cell other than said reference cell.

5. The semiconductor memory device according to claim 4, wherein said master reference cell comprises a fixed resistance.

6. The semiconductor memory device according to claim 1, wherein each of said memory cells and said reference cell comprises:

a nonvolatile variable resistance element whose electric resistance is changed by an electric stress and remains on the changed electric resistance even after said electric stress is removed; and a select transistor.

7. The semiconductor memory device according to claim 6, wherein said nonvolatile variable resistance element has a manganese-containing oxide of a perovskite structure formed between electrodes.

8. A semiconductor memory device comprising:

a plurality of memory cells each capable of storing and programming N-level data, where N is a natural number equal to or greater than 2;

a reference cell storing a reference level used when reading a data level stored in said memory cells;

a timing generation circuit; and check means for determining whether said reference level stored in said reference cell is within a preset range, in synchronicity with a synchronous signal output from said timing generation circuit.

9. The semiconductor memory device according to claim 8, comprising correction means for, if said check means determines that said reference level is out of said range, correcting the reference level to fall within said range.

10. The semiconductor memory device according to claim 9, wherein said correction means corrects said reference level using a master reference level fixed to a master reference cell other than said reference cell.

11. The semiconductor memory device according to claim 10, wherein said master reference cell comprises a fixed resistance.

12. The semiconductor memory device according to claim 8, wherein each of said memory cells and said reference cell comprises:

a nonvolatile variable resistance element whose electric resistance is changed by an electric stress and remains on the changed electric resistance even after said electric stress is removed; and a select transistor.

13. The semiconductor memory device according to claim 12, wherein said nonvolatile variable resistance element has a manganese-containing oxide of a perovskite structure formed between electrodes.

14. A method for correcting a reference cell, said reference cell storing a reference level used when reading a data level stored in a plurality of memory cells each capable of storing and programming N-level data, where N is a natural number equal to or greater than 2, the method comprising the steps of:

counting number of times of reading of said reference cell;

determining whether said reference level stored in said reference cell is within a preset range when said number of times of reading that is counted reaches a specified value; and correcting the reference value to fall within said range if it is determined that said reference level is out of said range.

15. A method for correcting a reference cell, said reference cell storing a reference level used when reading a data level stored in a plurality of memory cells each capable of storing and programming N-level data, where N is a natural number equal to or greater than 2, the method comprising the steps of:

determining whether said reference level stored in said reference cell is within a preset range, in synchronicity with a synchronous signal output from a timing generation circuit; and correcting the reference value to fall within said range if it is determined that said reference level is out of said range.

* * * * *